(12) United States Patent
Chompff

(10) Patent No.: US 10,098,251 B1
(45) Date of Patent: Oct. 9, 2018

(54) CABLE MANAGEMENT LACER BAR

(71) Applicant: A'n D Cable Products Inc., Concord, CA (US)

(72) Inventor: Conrad L. Chompff, Concord, CA (US)

(73) Assignee: A'N D CABLE PRODUCTS INC., Concord, CA (US)

( * ) Notice: Subject to any disclaimer, the term of this patent is extended or adjusted under 35 U.S.C. 154(b) by 0 days.

(21) Appl. No.: 15/696,631

(22) Filed: Sep. 6, 2017

(51) Int. Cl.
| | |
|---|---|
| *H02G 3/04* | (2006.01) |
| *H02G 3/30* | (2006.01) |
| *F16L 3/20* | (2006.01) |
| *H05K 7/14* | (2006.01) |
| *F16L 3/137* | (2006.01) |
| *F16L 3/26* | (2006.01) |
| *F16L 3/22* | (2006.01) |
| *H02G 3/00* | (2006.01) |
| *H04Q 1/06* | (2006.01) |

(52) U.S. Cl.
CPC ............ *H05K 7/1491* (2013.01); *F16L 3/137* (2013.01); *F16L 3/22* (2013.01); *F16L 3/26* (2013.01); *H02G 3/263* (2013.01); *H02G 3/30* (2013.01); *H04Q 1/06* (2013.01)

(58) Field of Classification Search
CPC .. H05K 7/1491; F16L 3/12; F16L 3/17; F16L 3/22; F16L 3/26; H04Q 1/06; H02G 3/263; H02G 3/30

USPC ............ 248/58, 65, 68.1, 69, 244, 49, 74.1; 174/28, 68.1, 68.2, 101; 361/826; 700/95, 159
See application file for complete search history.

(56) References Cited

U.S. PATENT DOCUMENTS

| | | | | |
|---|---|---|---|---|
| D294,667 | S * | 3/1988 | Handler | .......................... D6/569 |
| 6,568,542 | B1 * | 5/2003 | Chen | ........................ H04Q 1/06 |
| | | | | 211/26 |
| D626,817 | S * | 11/2010 | Donowho | ....................... D8/356 |
| 8,872,030 | B2 * | 10/2014 | McNeal | ..................... F16L 3/00 |
| | | | | 174/101 |
| 8,936,221 | B2 * | 1/2015 | Rouleau | .................... H02G 3/32 |
| | | | | 248/68.1 |
| D739,358 | S * | 9/2015 | Collier | ......................... D13/155 |
| 2006/0118685 | A1 * | 6/2006 | Schluter | ............... H05K 7/1448 |
| | | | | 248/244 |

* cited by examiner

*Primary Examiner* — Tan Le
(74) *Attorney, Agent, or Firm* — Zheng Liu; Weintraub Tobin

(57) ABSTRACT

The present disclosure provides example cable management tools, e.g., lacer bars, as well as systems and methods for manufacturing the same. An example cable management tool may comprise: a first part having one or more pairs of slots configured to be filled with cable ties, a second part connected to the first part and configured to be attached to a chassis; and a third part connected to the first part and configured to be attached to the chassis. Each pair, in the one or more pairs, of slots has two slots with a same shape. The first part, the second part, and the third part, of the cable management tool, may be parts of a single metal piece. Alternatively, the second part and the third part are detachable from the first part.

20 Claims, 7 Drawing Sheets

CABLE MANAGEMENT LACER BAR

TECHNICAL FIELD

The present disclosure generally relates to cable management tools and more specifically to a detachable cable management lacer bar.

BACKGROUND

Cable management often refers to spatially organizing electrical or optical cables inside a switch chassis, a cabinet, or an installation. Inside a switch chassis, for example, data and power cables can easily become tangled, making them difficult to work with and the computer equipment (to which these cables connect) inconvenient to access by an IT technologist. Second, dis-organized cables can block or reduce air flows needed to cool off the computer equipment, resulting in over-heating (on the equipment side) and ineffective heat management (on the data center side).

Effective cable management solutions should, therefore, not only support, but also contain cables within an installation. The above identified technical problems are reduced or eliminated by the systems and methods disclosed in the present disclosure.

Figure 1:
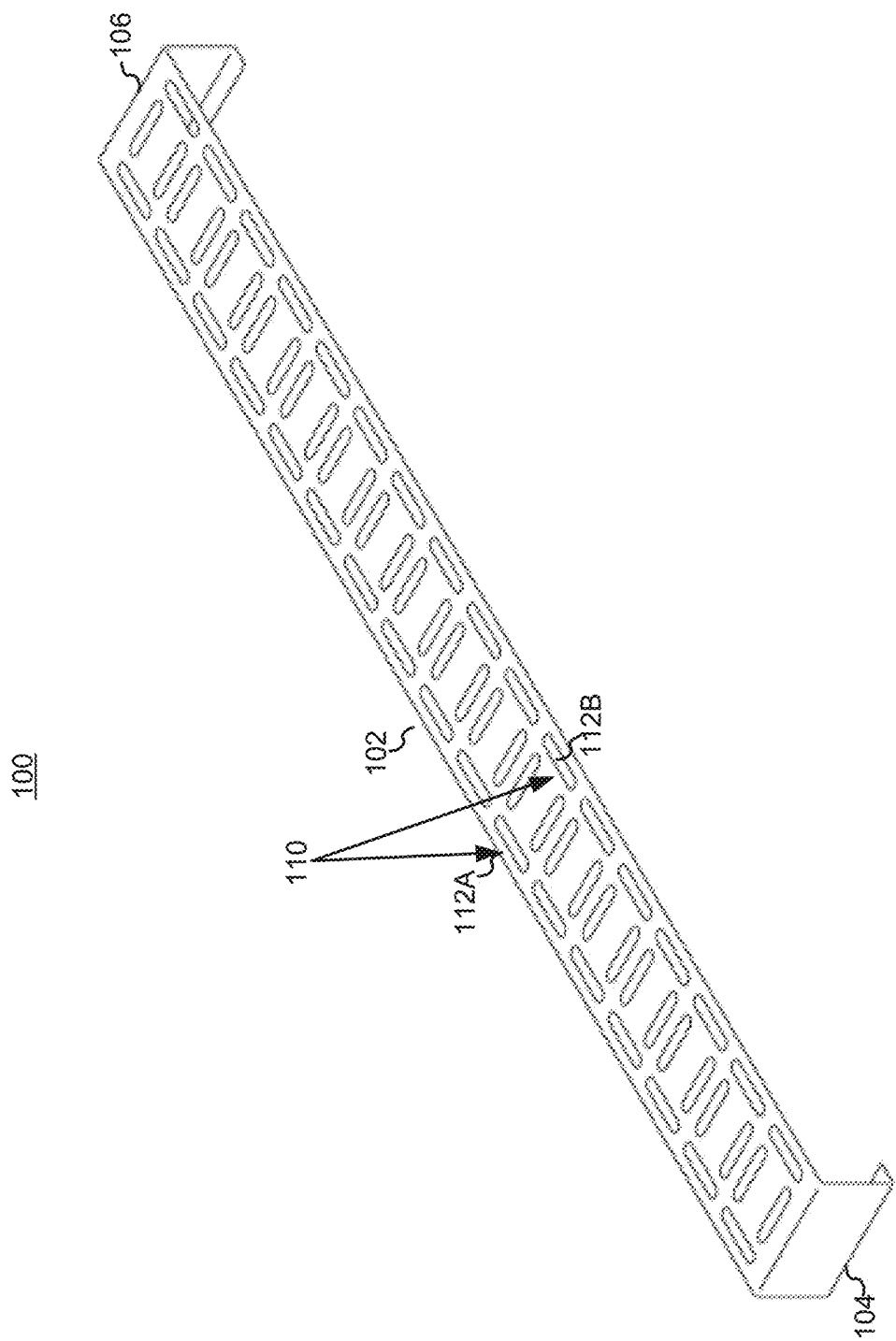
FIG. 1 is a block diagram illustrating a perspective view of an example cable management tool.

Embodiments of the present disclosure and their advantages are best understood by referring to the detailed description that follows. It should be appreciated that like reference numerals are used to identify like elements illustrated in one or more of the figures; showings therein are for purposes of illustrating embodiments of the present disclosure and not for purposes of limiting the same.

SUMMARY

Embodiments of cable management tools, as well as method and computer executable instructions for manufacturing the cable management tools are provided in the present disclosure.

A cable management tool, in some implementations, comprises: a first part having one or more pairs of slots configured to be filled with cable ties, a second part connected to the first part and configured to be attached to a chassis; and a third part connected to the first part and configured to be attached to the chassis. Each pair, in the one or more pairs, of slots has two slots with a same shape.

In some implementation, the cable ties to be used with the cable management tool include Velcro® OneWrap® hook and loop or double-sided hook and loop that has a width equal to or less than the width of the slot.

The first part of the cable management tool, in some implementations, is made of metal, molded plastic, or fiberglass, or any other material and can support cables.

The first part of the cable management tool, in some implementations, is of a rectangle bar shape.

The first part of the cable management tool, in some implementations, is configured to support a predefined number of cables.

The first part, the second part and the third part, of the cable management tool, are parts of a single metal piece. Alternatively, the second part and the third part are detachable from the first part.

The first part of the cable management tool, in some implementations, includes a hard-surface. The hard-surface provides a predefined degree of movement-resistance.

The second part and the third part, of the cable management tool, have different shapes. The second part and the third part may alternatively have a common shape. The common shape may be an "L" shape.

The one or more pairs of slots of the cable management tool may include a first set of pairs of slots and a second set of pairs of slots; the first set of pair of slots are vertical to the second set of pairs of slots.

In some implementations, the first set of pairs of slots may include slots of a first shape, and the second set of pairs of slots may include slots of a second shape different from the first shape.

In some implementations, the first set of pairs of slots may include slots of a first size, and the second set of pairs of slots may include slots of a second size different from the first size.

In some implementations, a respective pair, in the one or more pairs, of slots includes a predefined distance between slots in the respective pair.

The second part and the third part, when attached to the chassis, cause the first part to be movable only in a predefined direction, in some implementations.

In some implementations, a first edge of the first part has a greater thickness than a second edge of the first part. The first edge and the second edge may be edges on opposite sides of the first part.

A computer-implemented method for manufacturing the cable management tool as described in any of the implementations above.

A non-transitory computer readable medium comprising computer executable instructions stored thereon, which, when executed by one or more computers, cause a machine to manufacture the cable management tool as described in any of the implementations above.

DETAILED DESCRIPTION

The present disclosure provides example cable management tools, e.g., lacer bars, as well as systems and methods for manufacturing the same. The technologies described in the present disclosure can provide the following technical advantages. First, a chassis capable of providing greater physical cable support can support a larger number of computing devices and their connection cables on the chassis, saving real estate in a data room. Second, making the cable support detachable from the chassis provides more flexibility for a computer technologist to organize computer or network equipment on a rack and in a data room. Third, providing specific cable tie positions helps further contain cables within a chassis, making the computer equipment accommodated on the chassis more accessible to a technician or the like. Additional details of implementations are now described in relation to the Figures.

FIG. 1 is a block diagram illustrating a perspective view of an example cable management tool 100.

As shown in FIG. 1, a cable management tool, in some implementations, is a detachable cable management lacer bar. For example, a lacer bar that can be attached to and detached from a chassis through which cable may go.

As shown in FIG. 1, an example lacer bar 100 may be deemed to consist of three parts: a first part 102, a second part 104, and a third part 106. The first part 102 may also be referred to as a supporting surface in the present disclosure, as the first part 102 provides physical support to cables within a chassis (to which the cable management tool 100 is attached).

The supporting surface 102 may include one or more pairs of slots. For example, an example slot-pair 110 includes slot 112A and slot 112B. Cable ties can go through the slots 112A and 112B to secure a cable to the first part 102. Similarly, slots on the other orientation, for example, the pair 204 of slots shown in FIG. 2 can also be used to secure a data cable to the supporting surface 102.

In some implementations, slots included in a slot-pair have a same shape so that a uniformly-shaped cable tie, e.g., a pipe-shaped cable tie, can go through both slots in the pair. In other implementations, slots included in a slot-pair may have different shapes, e.g., different sizes or shapes of openings, to accommodate cable ties having varying shapes, e.g., a cable tie that is slimmer on one end, but increases its thickness gradually towards the other end.

Both the second part 104 and the third part 106 are connected to the first part and configured to be attached to a chassis. Attaching the second part 104 and the third part 106 to a chassis would result in the first part 102 to be also secured to the chassis, containing the positions of the cables secured to the first part 102 within the chassis. Because the second part 104 and the third part 106 can be snapped onto the racks of a chassis, the second part 104 and the third part 106 may also be referred to as snap-on parts in the present disclosure.

In some implementations, the first part 102, the second part 104 and the third part 106 (in other words, the snap-on parts and the supporting surface) are made of a single metal piece, e.g., for the ease of molding, manufacturing, or both.

Alternatively, in other implementations, the snap-on parts 104 and 106 are detachable from the supporting surface 102. For example, the second part 104 and the third part 106 are separate pieces that can be latched or fastened to and detached from the first part 102, on an as-needed basis. Having the second part 104 and the third part 106 separable from (e.g., attachable to and detachable from) the first part 102 is technically advantageous, as these techniques would allow the second part 104 and the third part 106 to be customized to the design of a chassis and racks provided thereon, without the needed to modify the design of first part 102 or re-manufacturing the entire lacer bar.

As shown in FIG. 1, the first part 102 of the cable management tool 100, in some implementations, is of a rectangle bar shape. In some implementations, the first part 102 is of a different shape, for example, a square shape or a slimmer bar shape, to provide more support to heavy-duty wires or cables or to save room within the chassis for other equipment, respectively. In the implementations where several lacer bars are equipped to a chassis, as explained with reference to FIG. 3, the several lacer bars may each have a different design (e.g., made of different materials or having different shapes or slot openings).

The first part 102 of the cable management tool 100, in some implementations, is made of metal, hard plastic, PVC materials, or a combination of these materials, to provide sufficient support to cable located within a chassis.

The first part 102 of the cable management tool 100, in some implementations, is configured to support a predefined number of cables. For example, the first part 102 may be designed to specifically support a particular number of cables, e.g., 10, 20, 30, or 50, if the capacity of a chassis (e.g., the total number of computing equipment to be placed or included in the chassis) is known. These customization techniques allow a lacer cable bar to be customized to its potential capacity or intended utility with reduced budget and lesser manufacturing material.

The first part 102 of the cable management tool 100, in some implementations, includes a hard-surface. The hard-surface may provide a predefined degree of movement-resistance. For example, the upper surface of the first part 102 may be covered with a rubber layer to further restrain the movement of cables within a chassis. For another example, the surface of the first part 102 may be covered with materials that provide a predefined amount of physical movement resistance, such that force incidentally generated by nearby devices (e.g., air flows generated by a heat dissipation fan located within the same chassis) would not result in unintended cable movement.

Figure 3:
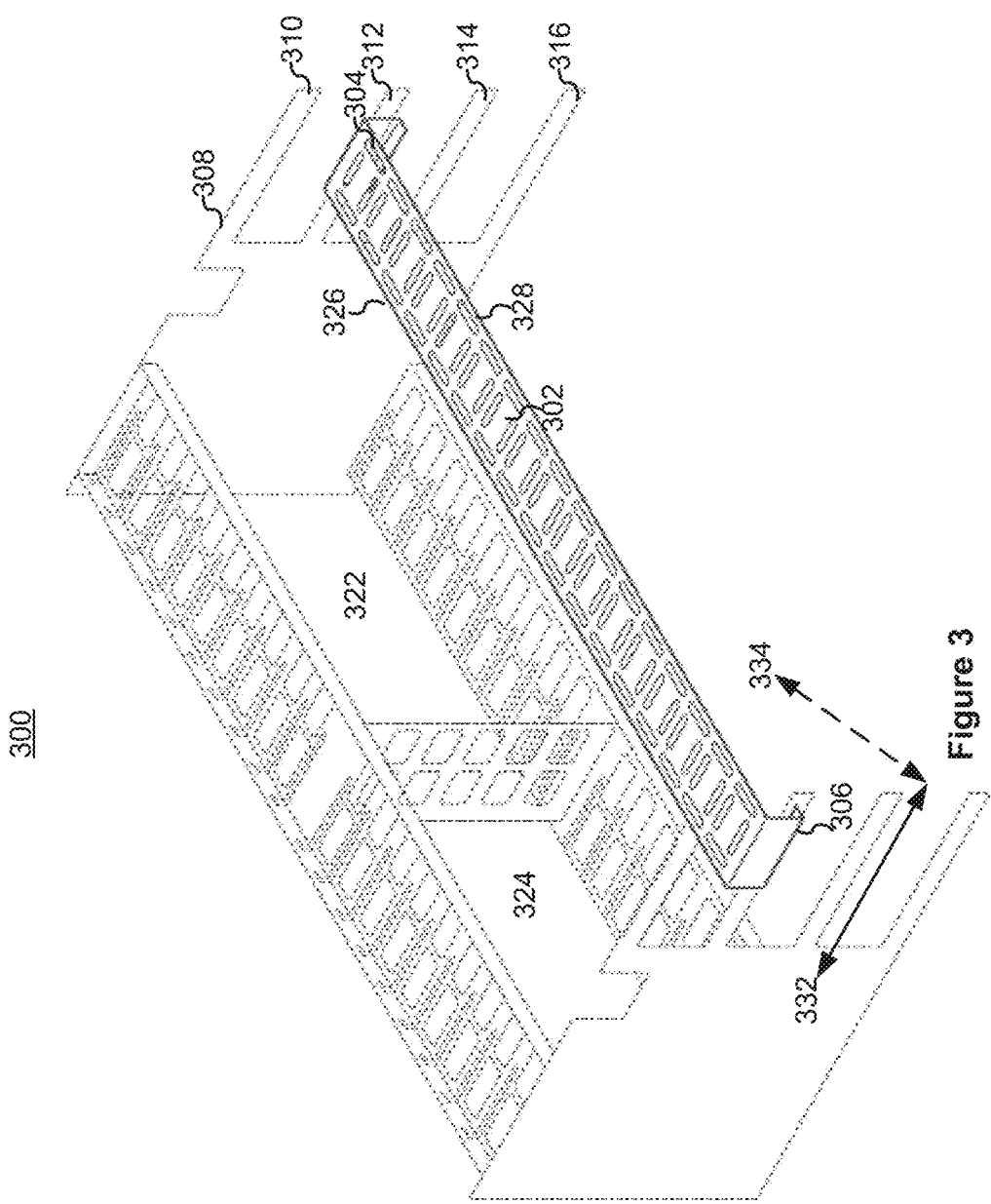
FIG. 3 is a block diagram illustrating a perspective view of an example cable management tool attached to an example chassis.

The second part 104 and the third part 106 of the cable management tool 100 may have a common shape. The common shape may be an "L" shape. As shown in FIG. 3, the L shape can offer a greater degree of fastening ability between a lacer bar and a chassis, without significantly increasing the difficulties for uninstallation or modification. For example, an L shape would allow the second part 104 and the third part 106 to be more easily snapped onto (e.g., attached to) and taken off (e.g., detached from) the first part 102.

The second part 104 and the third part 106 may alternatively have different shapes, for example, when the racks (on a same chassis) to which these parts may be attached have different shapes or different fastening mechanisms.

The present disclosure also provides various holing technologies relating to a supporting surface 102. The one or more pairs of slots of the cable management tool 1006 may include a first set of pairs of slots and a second set of pairs of slots; the first set of pair of slots are vertical to the second set of pairs of slots.

Slots included different slot-pairs may have different shapes. In some implementations, the first set of pairs of slots may include slots of a first shape, and the second set of pairs of slots may include slots of a second shape different from the first shape. For example, the slot-pair 202 may provide slots that are of a substantially rectangle shape, while the slot-pair 204 may provide slots that are of a substantially round shape.

Slots included different slot-pairs may have different sizes. In some implementations, the first set of pairs of slots may include slots of a first size, and the second set of pairs of slots may include slots of a second size different from the first size. For example, the slot-pair 202 may provide round slots that are 0.2" in diameter, while the slot-pair 204 may provide round slots that are 0.4" in diameter.

Different slot-pairs may have different sizes (e.g., widths or heights). In some implementations, a respective pair, in the one or more pairs, of slots includes a predefined distance between slots in the respective pair. For example, the distance or size of a slot-pair can be customized to accommodate cable having different sizes. A narrower slot-pair may better secure a thinner cable, e.g., a smaller USB cable; while a wider slot-pair may better secure a wider cable, e.g., a heavy-duty power cable.

The second part and the third part, when attached to the chassis, cause the first part to be movable only in a predefined direction, in some implementations. For example, placing the bar 302 on the second level 312 of the chassis 308 would restrict the movement of the bar 302 in the vertical direction 334, but may still enable a certain degree of movement in the direction 332.

Different edges, edges on the opposite sides, of a supporting surface may provide different thicknesses. For example, edge 328 of the lacer bar 302 may be thicker than the edge 326 of the lacer bar 302, in order to provide movement resistance in a different direction, e.g. upward or downward.

Figure 2:
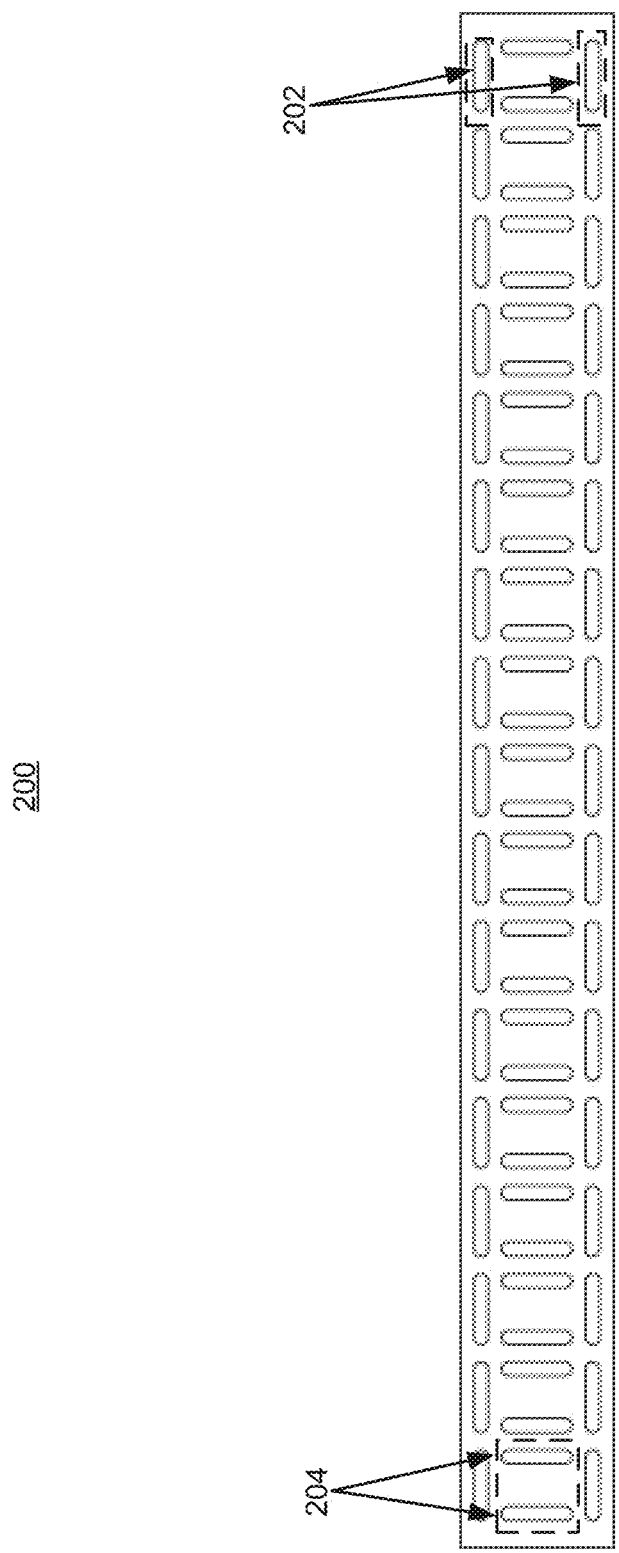
FIG. 2 is a block diagram illustrating a top view of an example cable management tool.

FIG. 2 is a block diagram illustrating a top view of an example cable management tool, e.g., a lacer bar 200.

As shown in FIG. 2, the slot-pair 202 includes two horizontally-positioned slots on the right of the lacer bar 200; the slot-pair 204 includes two vertically-positioned slots on the left of the lacer bar 200. The lacer bar 200 accommodates 17 vertical slot-pairs and 17 horizontal slot-pairs. In some implementations, the total number of vertical slot-pairs provided on a lacer bar may be different from the total number of horizontal slot-pairs provided. These customization techniques can provide greater flexibility in terms of cable management, as the number of cables to be managed horizontally may be different from that of cables to be managed vertically.

FIG. 3 is a block diagram illustrating a perspective view of an example cable management tool and an example chassis, for example, a lacer bar 302 and a chassis 308. As shown in FIG. 3, the lacer bar 302 may be attached to different parts (e.g., different positions) of the chassis 308. The different positions of the chassis 308 to which the lacer bar 302 may be attached, as shown in FIG. 3, include, level 310, level 312, level 314, and level 316.

A layering-effect may be provided. Several lacer bars 302 may be attached to the chassis 308 at the same time; cables going into or coming out of the spaces 322 and 324 may be secured to different lacer bars attached to the different levels of the chassis 308, separating cable onto different spatial layers.

Figure 4A:
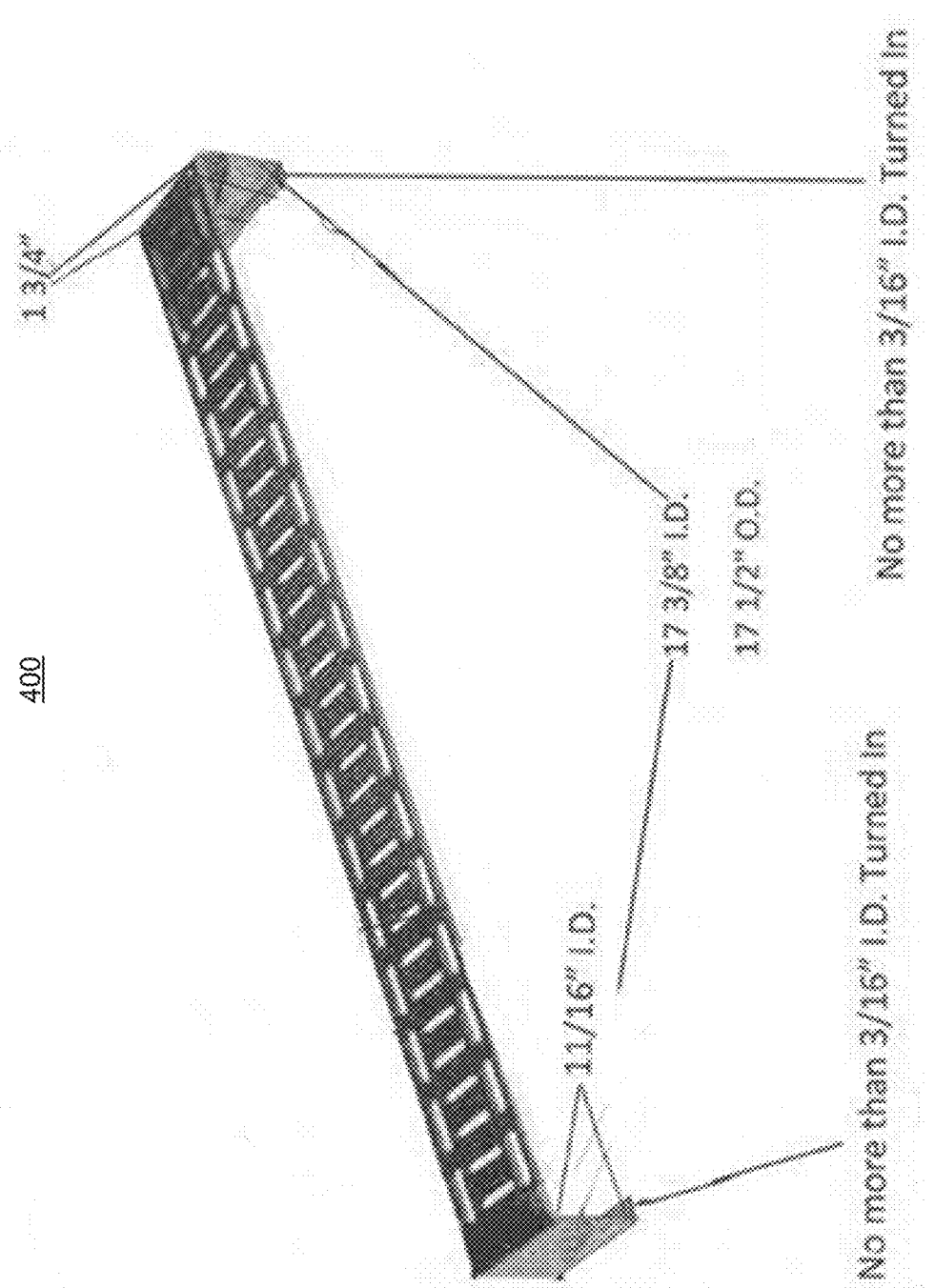
FIG. 4A is a block diagram illustrating a perspective view of an example cable management tool.

FIG. 4A is a block diagram illustrating a perspective view of an example cable management tool 400.

As shown in FIG. 4A, the width of the first part 102 may be 1¾"; the length of the first part 102 may be 17⅜" I.D. and 17½" O.D. Both the second part and the third part may have a no more than 3/16" I.D turned in; the height of the second part and the third part may be 11/16" I.D.

Other dimensions may also be used on the first part, the second part, and the third part to accommodate different chassis.

Figure 4B:
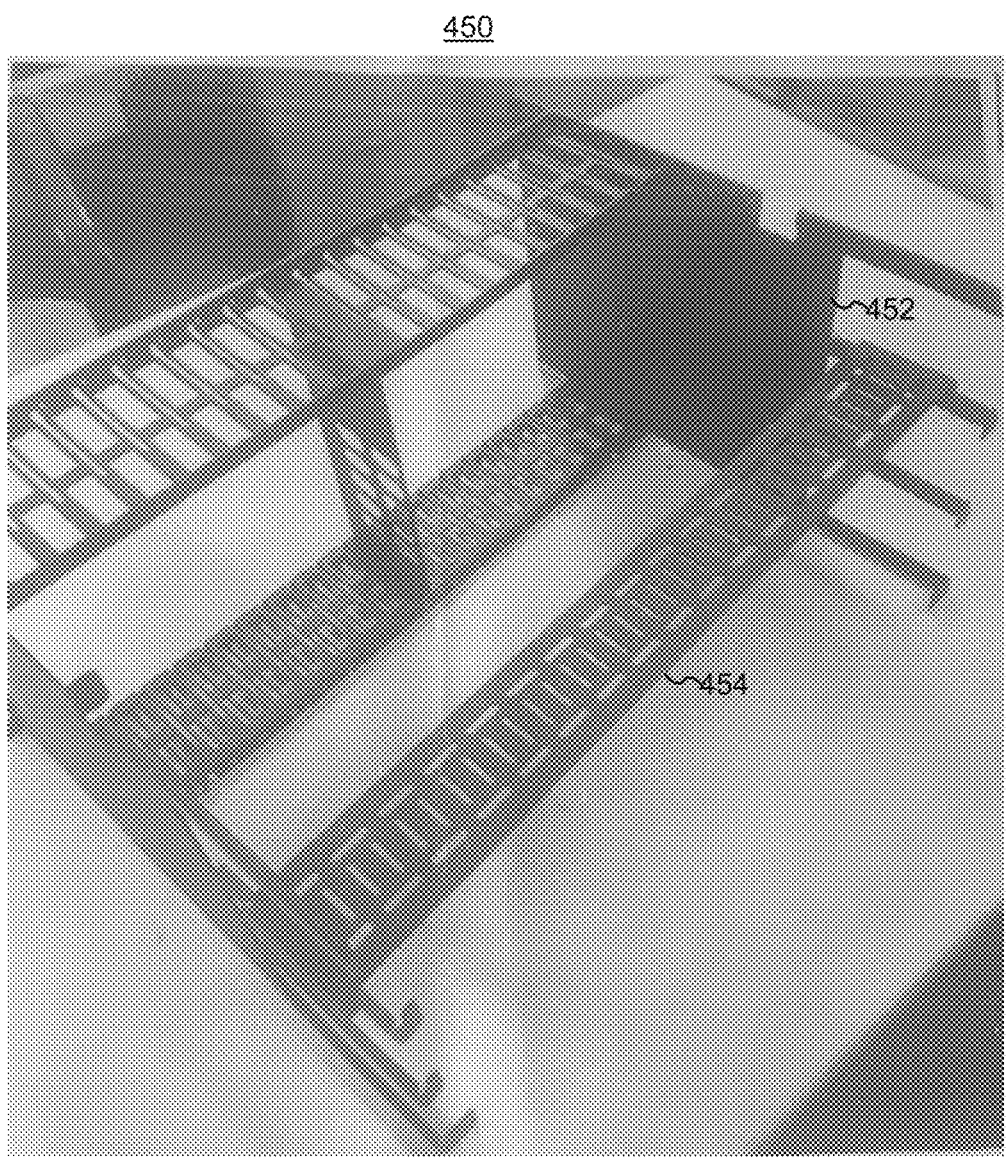
FIG. 4B is a block diagram illustrating a perspective view of an example cable management tool attached to an example chassis.

FIG. 4B is a block diagram illustrating a perspective view of an example lacer bar 454 attached to an example chassis 452.

As shown in FIG. 4B, the lacer bar 454 is snapped onto racks on the second top level of the chassis 452.

Figure 5:
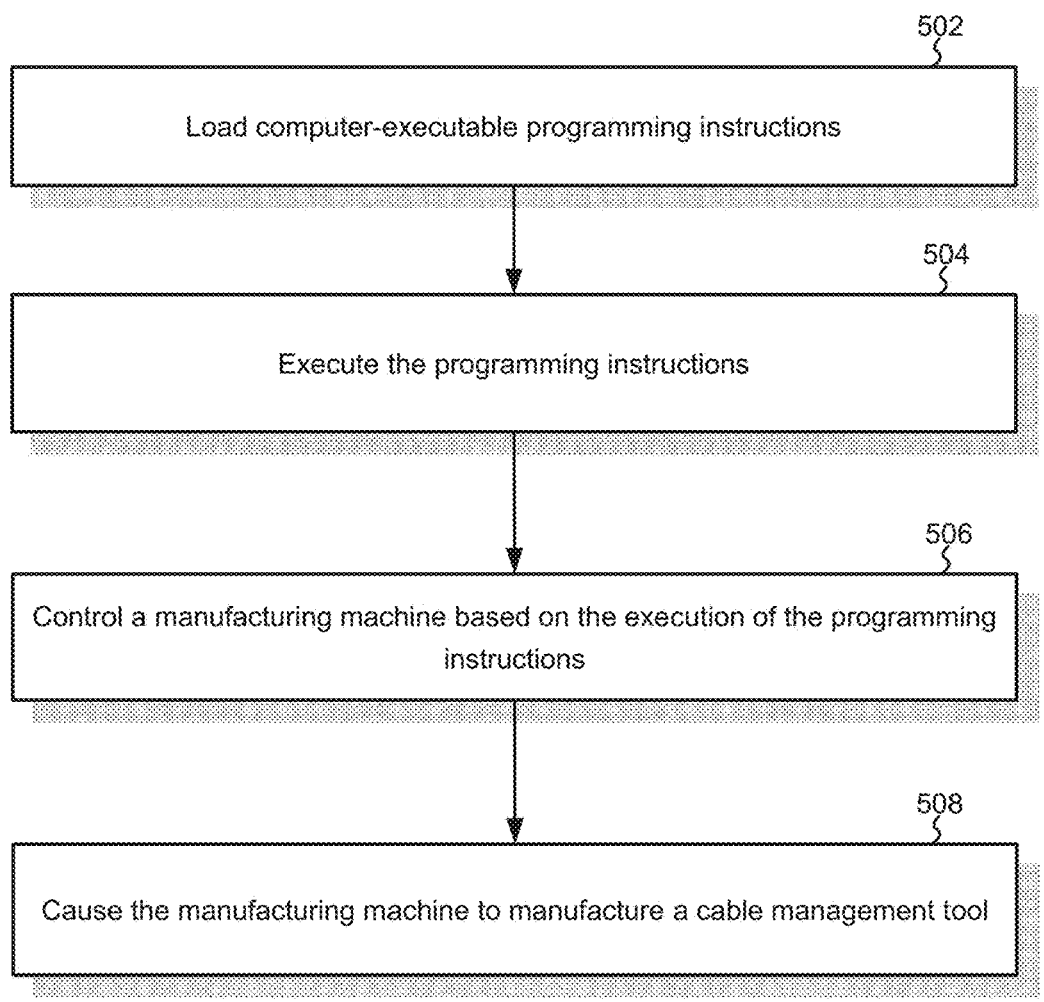
FIG. 5 is a flowchart illustrating an example method for manufacturing a cable management tool.

FIG. 5 is a flowchart illustrating an example computer-implemented method 500 for manufacturing a cable management tool. The computer system 600, when properly programmed, can execute the method 500.

In some implementations, the method 500 includes using a computer to load (502) computer-executable programming instructions from a non-volatile memory of the computer to a volatile memory of the computer.

After loading the programming instructions, the computer may execute (504) the programming instructions using the volatile memory.

Based on the execution of the programming instructions, the computer may control (506) a manufacturing machine, for example, a cutting machine, a molding machine, or a pressing machine.

By controlling the manufacturing machine, the computer causes (508) the manufacturing machine to manufacture a cable management tool as described in one or more of the implementations disclosed in the present disclosure.

Figure 6:
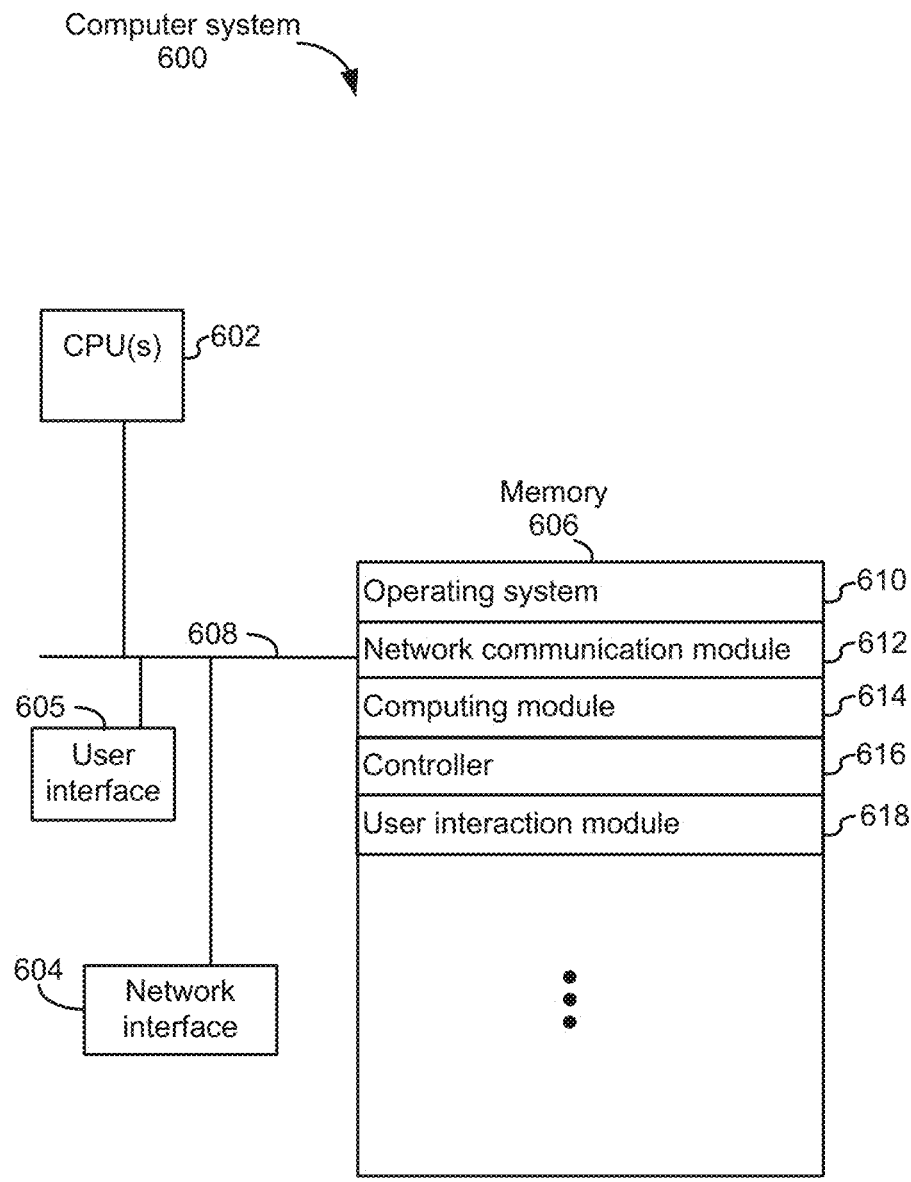
FIG. 6 is a block diagram illustrating an example computer system for manufacturing a cable management tool.

FIG. 6 is a block diagram illustrating an example computer system 600 for manufacturing a cable management tool. The computer system 600 in some implementations includes one or more processing units CPU(s) 602 (also referred to as processors), one or more network interfaces, optionally a user interface, a memory 606, and one or more communication buses 610 for interconnecting these components. The communication buses 610 optionally include circuitry (sometimes called a chipset) that interconnects and controls communications between system components. The memory 606 typically includes high-speed random access memory, such as DRAM, SRAM, DDR RAM or other random access solid state memory devices; and optionally includes non-volatile memory, such as one or more magnetic disk storage devices, optical disk storage devices, flash memory devices, or other non-volatile solid state storage devices. The memory 606 optionally includes one or more storage devices remotely located from the CPU(s) 100. The memory 606, or alternatively the non-volatile memory device(s) within the memory 606, comprises a non-transitory computer readable storage medium. In some implementations, the memory 606 or alternatively the non-transitory computer readable storage medium stores the following programs, modules and data structures, or a subset thereof:
- an operating system 610 (e.g., an embedded Linux operating system), which includes procedures for handling various basic system services and for performing hardware dependent tasks;
- a network communication module 612 for connecting the computer system with a manufacturing machine via one or more network interfaces (wired or wireless);
- a computing module 614 for executing programming instructions;
- a controller 616 for controlling a manufacturing machine in accordance with the execution of programming instructions; and
- a user interaction module 618 for enabling a user to interact with the computer system 600.

One or more of the above identified elements may be stored in one or more of the previously mentioned memory devices, and correspond to a set of instructions for performing a function described above. The above identified modules or programs (e.g., sets of instructions) need not be implemented as separate software programs, procedures or modules, and thus various subsets of these modules may be combined or otherwise re-arranged in various implementations. In some implementations, the memory optionally stores a subset of the modules and data structures identified above. Furthermore, the memory may store additional modules and data structures not described above.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation(s).

It will also be understood that, although the terms "first," "second," etc. may be used herein to describe various elements, these elements should not be limited by these terms. These terms are only used to distinguish one element from another. For example, a first pair of slots could be termed a second pair of slots, and, similarly, a second pair of slots could be termed a first pair of slots, without changing the meaning of the description, so long as all occurrences of the "first pair of slots" are renamed consistently and all occurrences of the "second pair of slots" are renamed consistently. The pair of slots device and the second pair of slots are both pairs of slots, but they are not the same pair of slots.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. A cable management tool, comprising:
   a first part defined by two elongated edges having different thicknesses and two side edges,
      wherein the first part includes a plurality of pairs of slots configured to be filled with cable ties,
      wherein each pair, in the plurality of pairs, of slots includes two slots with a same shape,
      wherein the first part includes a first set of vertical pairs of slots and a second set of horizontal pairs of slots,
      wherein the first set of vertical pairs of slots and the second set of horizontal pairs of slots have a same number of pairs of slots;
      wherein slots in the first set of vertical pairs of slots are centrally located on the first part and have same space intervals therebetween, vertical to the two elongated edges, and parallel to the two side edges;
      wherein slots in the second set of horizontal pairs of slots are located along the elongated edges, vertical to the two side edges, and have same space intervals therebetween,
      wherein the first part has a powder-coated surface that includes rubber;
   a second part connected to the first part and configured to be attached to a chassis; and
   a third part connected to the first part and configured to be attached to the chassis, wherein the second part and the third part are both of an L shape and connected to the two side edges of the first part on top side of the L shape; and
   the second and third parts have a same length as a width of the first part.

2. The cable management tool of claim 1, wherein the first part is made of metal.

3. The cable management tool of claim 1, wherein the first part is of a rectangle bar shape.

4. The cable management tool of claim 1, wherein the first part is configured to support a predefined number of cables.

5. The cable management tool of claim 1, wherein the first part, the second part and the third part are parts of a single metal piece.

6. The cable management tool of claim 1, wherein the second part and the third part are detachable from the first part.

7. The cable management tool of claim 1, wherein the first part has a hard-surface.

8. The cable management tool of claim 7, wherein the hard-surface provides a predefined degree of movement-resistance.

9. The cable management tool of claim 8, wherein the hard-surface includes rubber.

10. The cable management tool of claim 1, wherein the second part and the third part are snap-on parts.

11. The cable management tool of claim 1, wherein the second part and the third part have a same length as a width of the first part.

12. The cable management tool of claim 1, wherein the first set of vertical pairs of slots are vertical to the second set of horizontal pairs of slots.

13. The cable management tool of claim 12, wherein the first set of vertical pairs of slots includes slots of a first shape, and the second set of horizontal pairs of slots includes slots of a second shape different from the first shape.

14. The cable management tool of claim 12, wherein the first set of vertical pairs of slots includes slots of a first size, and the second set of horizontal pairs of slots includes slots of a second size different from the first size.

15. The cable management tool of claim 1, wherein a respective pair, in the plurality of pairs, of slots includes a predefined distance between slots in the respective pair.

16. The cable management tool of claim 1, wherein the second part and the third part, when attached to the chassis, causes the first part to be movable only in a predefined direction.

17. The cable management tool of claim 1, wherein the two elongated edges include a first elongated edge facing outwards away from the chassis and a second elongated edge facing inwards into the chassis, and the first elongated edge is thicker than the second elongated edge.

18. The cable management tool of claim 1, wherein the two elongated edges are edges on opposite sides of the first part.

19. The cable management tool of claim 1, wherein the plurality of pairs of slots include a total of seventeen pairs of slots.

20. The cable management tool of claim 1, wherein the second part and the third part, when attached to the chassis, are configured to render the first part non-movable on the chassis.

* * * * *